United States Patent [19]

Hunter et al.

[11] Patent Number: 4,541,005
[45] Date of Patent: Sep. 10, 1985

[54] SELF-POSITIONING HEAT SPREADER

[75] Inventors: William L. Hunter, Scottsdale, Ariz.; Paul R. Theobald, Austin, Tex.

[73] Assignee: Motorola, Inc., Schaumburg, Ill.

[21] Appl. No.: 595,646

[22] Filed: Apr. 2, 1984

Related U.S. Application Data

[63] Continuation of Ser. No. 365,114, Mar. 30, 1982, abandoned.

[51] Int. Cl.³ .................... H01L 23/30; H01L 23/36
[52] U.S. Cl. ........................ 357/81; 357/72; 357/68
[58] Field of Search ............... 357/81, 70, 72; 174/16 HS

[56] References Cited

U.S. PATENT DOCUMENTS

| | | | |
|---|---|---|---|
| 3,908,185 | 9/1975 | Martin | 357/70 X |
| 4,132,856 | 2/1979 | Hutchison et al. | 357/81 X |
| 4,392,152 | 7/1983 | Hirano | 357/80 |

FOREIGN PATENT DOCUMENTS

| | | | |
|---|---|---|---|
| 2004768 | 8/1971 | Fed. Rep. of Germany | 357/81 |
| 2606949 | 8/1977 | Fed. Rep. of Germany | 357/70 |
| 2107786 | 7/1978 | Fed. Rep. of Germany | 357/81 |
| 53-126275 | 4/1978 | Japan | 357/81 |
| 55-134951 | 10/1980 | Japan | 357/81 |

Primary Examiner—Andrew J. James
Assistant Examiner—Sheila V. Clark
Attorney, Agent, or Firm—Anthony J. Sarli, Jr.; Jeffrey Van Myers; Robert L. King

[57] ABSTRACT

A heat spreader which is self-positioning into a mold cavity prior to encapsulation in plastic is provided. To minimize capacitance between the spreader and a metal lead frame having a semiconductor die mounted thereon, the heat spreader has a frame with notches in the opposite ends which define bifurcated limbs. Lateral standoffs extend from each of the sides thereof and feet extend from the bottom surface thereof. A central portion extends a predetermined distance from the top surface thereof for intimate positioning with the lead frame. The standoffs, limbs and feet are sized to firmly position the heat spreader upon insertion into the mold cavity. To maintain substantially constant capacitance between the spreader and the lead frame from part to part, each bifurcated limb has an inner edge which complements or conforms to the portion of the lead frame which will overlay the limb in the encapsulated plastic.

7 Claims, 4 Drawing Figures

SELF-POSITIONING HEAT SPREADER

This is a continuation of application Ser. No. 365,114, filed Mar. 30, 1982 now abandoned.

TECHNICAL FIELD

This invention relates generally to heat spreaders and, more particularly, to a heat spreader adapted for insertion into a mold cavity prior to plastic encapsulation with a semiconductor device.

BACKGROUND ART

Metal heat spreaders of various shapes and designs have been commonly used to spread or conduct heat away from a metal lead frame which is electrically connected to an integrated circuit die. One application of such heat spreaders has been to physically attach the heat spreader to the metal lead frame wherein both the heat spreader and lead frame are encapsulated in plastic. In such an application, a heat spreader is used to spread heat in a relatively uniform manner throughout plastic and is not used for contact to an external heat sink. When heat spreaders have an exposed surface, poor adhesion between plastic and metal may allow moisture to enter into the package. Exposed metal surfaces may also result in a fragile structure. A disadvantage with heat spreaders that are directly connected to a metal lead frame is that achieving the physical connection requires a separate manufacturing step. A further disadvantage with such heat spreaders is the fact that capacitance exists between the heat spreader which acts as one long conducting surface or plate and the lead frame which acts as another conducting surface or plate. Since the lead frame has different voltages at various points during operation and the distance separating the two conducting surfaces is small, a large capacitance is created between the two surfaces. For some applications the capacitance does not present a significant problem. However, in many high speed circuits, such as a microprocessor, the capacitance can be a severe problem. Another problem is the variation in capacitance from part to part which results from variation in the position of the heat spreader with respect to the lead frame. As a result of the variation of capacitance from part to part, a heat spreader configuration may be acceptable for some parts but be unacceptable for other parts having different lead frame configurations.

BRIEF SUMMARY OF THE INVENTION

Accordingly, an object of the present invention is to provide an improved heat spreader which is self-positioning in a mold cavity prior to plastic encapsulation.

Another object of the present invention is to provide an improved heat spreader having a configuration in which capacitance between the heat spreader and a lead frame is minimized.

Another object of the present invention is to provide an improved heat spreader having substantially the same amount of capacitance between itself and a lead frame from part to part.

A further object of the present invention is to provide an improved heat spreader which is anodized and self-positioning in a mold cavity prior to plastic encapsulation.

Yet another object of the present invention is to provide an improved heat spreader for use in a semiconductor package having a low thermal impedance.

In carrying out the above and other objects of the present invention, there is provided, in one form, a self-positioning heat spreader adapted for insertion into a mold cavity prior to encapsulation with an encapsulant such as plastic. The heat spreader is placed into the mold cavity and is parallel to a first surface of a metal lead frame which has a semiconductor die connected to a second surface. The heat spreader has a frame with notches at opposite ends to reduce capacitance and which define bifurcated limbs which are sized to extend to within a predetermined tolerance of the end walls of the mold cavity. In order to make capacitance substantially uniform from unit to unit, the inner edges of each limb complement the portion of the lead frame which overlays the limb. A pair of spaced-apart lateral standoffs extend from each side of the heat spreader to within a predetermined tolerance of the side walls of the mold cavity. At least a pair of feet extend a predetermined distance below the lead frame, and a central portion extends to within a predetermined tolerance of the bottom surface of the lead frame. At least one surface of the heat spreader is covered with an insulation such as anodization to prevent electrical contact between the heat spreader and the lead frame.

DETAILED DESCRIPTION OF THE PREFERRED EMBODIMENT

Figure 1:
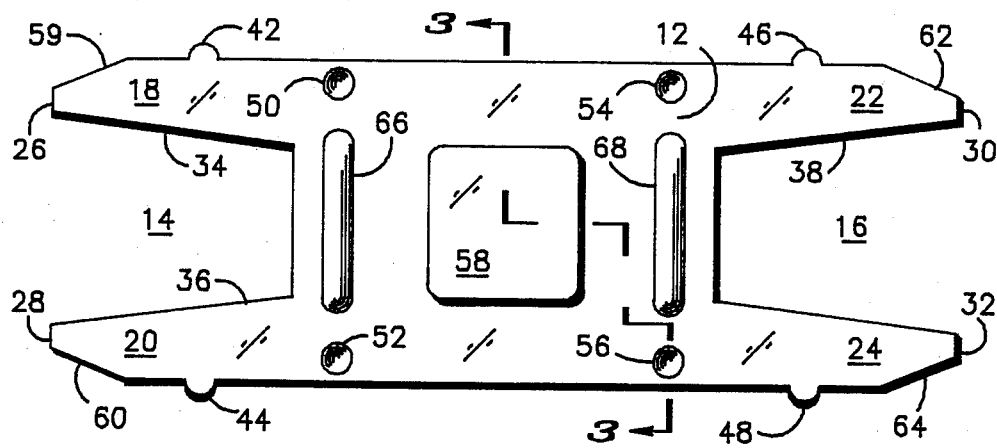
FIG. 1 illustrates a top plan view of a self-positioning heat spreader constructed in accordance with the preferred embodiment of the present invention.
Figure 4:
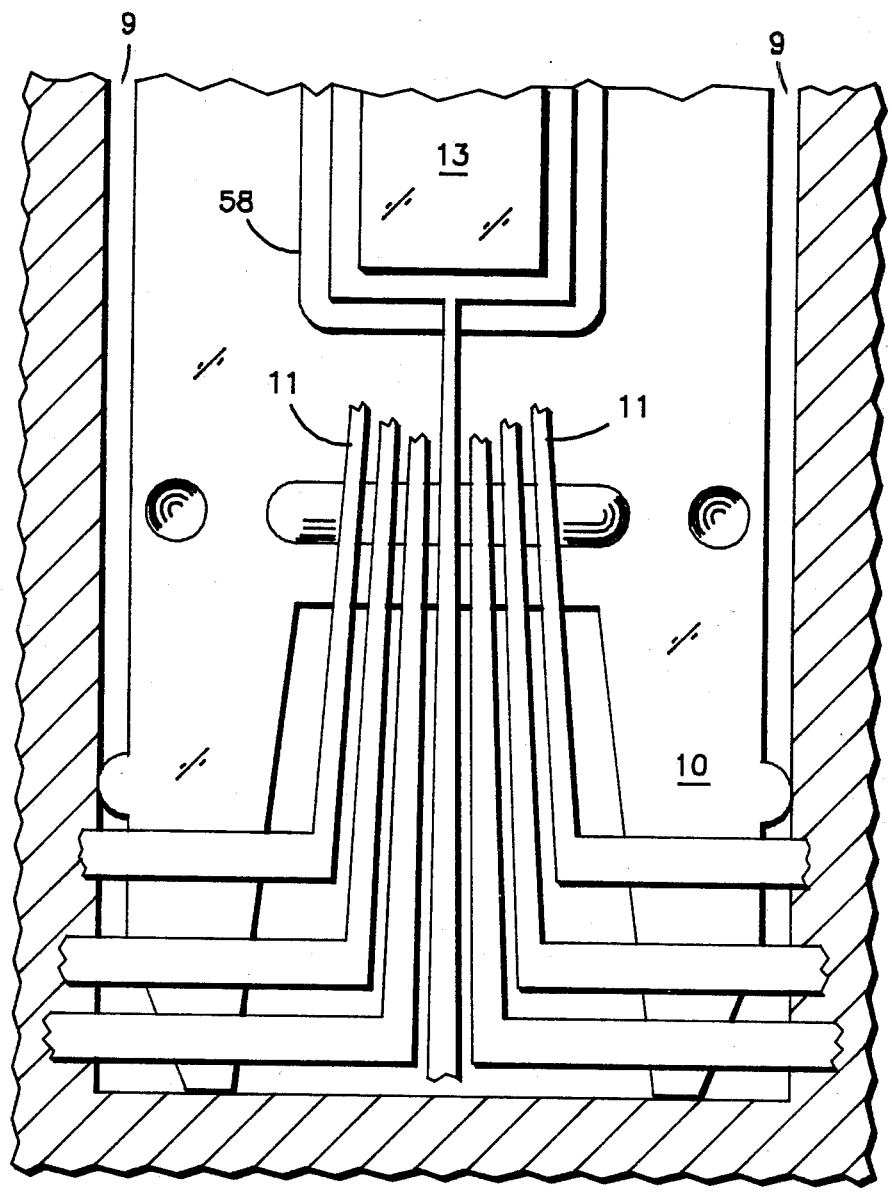
FIG. 4 illustrates a top plan view of the heat spreader of FIG. 1 in conjunction with a lead frame and a mold cavity.

Shown in FIG. 1 is a heat spreader 10 constructed in accordance with the preferred embodiment. Heat spreader 10 may be inserted into either a lower or an upper half of a mold cavity 9 (see FIG. 4). Although a lower thermal impedance may be obtained when heat spreader 10 is utilized in an upper half of mold cavity 9, heat spreader 10 is typically utilized in a lower half of mold cavity 9. In such a conventional fabrication of an encapsulated integrated circuit, an upper half of a mold cavity containing a lead frame 11 (see FIG. 4) which is connected to a semiconductor die 13 is positioned within the lower half of the mold cavity 9. The semiconductor die 13 has electrical wires (not shown) extending therefrom to the lead frame. Both halves of the mold cavity 9 are filled with an encapsulant, such as molten plastic, to form an encapsulated semiconductor device.

In a preferred form, heat spreader 10 comprises an elongated heat conductive frame 12 which is metal, such as aluminum, and is completely anodized or insulated. Although heat spreader 10 is preferably metal, heat spreader 10 may be fabricated from any other material which has a greater heat conductivity than the encapsulant. While it will be understood that heat conductive frame 12 is preferably elongated, a substantially square frame may also be used. At the two ends of heat conductive frame 12 is a notch 14 and a notch 16, respectively. A pair of bifurcated limbs 18 and 20 surround notch 14 and a pair of bifurcated limbs 22 and 24 surround notch 16. Limbs 18 and 20 terminate with an end edge 26 and an end edge 28, respectively. Limbs 22 and 24 terminate with an end edge 30 and an end edge 32, respectively. Limbs 18 and 20 have an inner edge 34 and an inner edge 36, respectively, and limbs 22 and 24 have an inner edge 38 and an inner edge 40, respectively. Lateral standoffs 42, 44, 46 and 48 extend from the outer sides of limbs 18, 20, 22 and 24, respectively. Extending a predetermined distance from the lower surface of heat spreader 10 are feet 50, 52, 54 and 56. A central portion 58 extends from the top surface of heat spreader 10 to within a predetermined tolerance of the bottom surface of lead frame 11.

Feet 50, 52, 54 and 56 help position and support heat spreader 10 from the floor of the mold cavity 9. A primary purpose of feet 50, 52, 54 and 56 is to elevate elongated heat conductive frame 12 from the bottom surface of the mold cavity 9. As a result, heat spreader 10 does not have an exposed surface as a heat sink would and is essentially totally encapsulated. Complete encapsulation is important since plastic does not always strongly adhere to metal. When a metal surface of heat spreader 10 is exposed, moisture can often enter the metal-plastic interface. Further, heat spreader 10 may be inadvertently pulled out or just come out of the plastic if exposed. Feet 50, 52, 54 and 56 therefore extend below heat spreader 10 a predetermined distance to insure that the lower surface of heat spreader 10 is totally encapsulated in plastic. Although four distinct feet have been shown in a preferred form, either as few as two or more than four feet may be used. When only two feet are used, both feet are positioned toward the opposite end of heat spreader 10 from the end in which the encapsulant enters. The flow of encapsulant allows the end having no feet to be slightly raised from the mold cavity.

The purpose of central portion 58 is to put only a portion of metal heat spreader 10 in close proximity to the lead frame 11. The reason for putting only a portion of heat spreader 10 in close proximity to the lead frame 11 is to minimize the capacitance which exists between the two conducting surfaces. Such capacitance increases as the the distance or thickness of the plastic dielectric between the surfaces decreases. However, the lead frame 11 and heat spreader 10 can not be separated by a large distance without seriously reducing the heat spreading ability of heat spreader 10. Central portion 58 may be placed virtually adjacent the lead frame 11 because heat spreader 10 is anodized to have an electrically insulating skin. As a result, even if no plastic separates heat spreader 10 and a lead frame, heat spreader 10 will not electrically contact an electronic circuit which is attached to the lead frame 11.

Lateral standoffs 42, 44, 46 and 48 are essential for heat spreader 10 to be self-positioning into the mold cavity 9. Lateral standoffs extend into within a first predetermined tolerance of the side walls of the cavity 9 so that when heat spreader 10 is dropped into the cavity 9, heat spreader 10 is substantially parallel to the lead frame 11. Further, when plastic is flowing through the mold cavity 9, heat spreader 10 will not be able to move sideways. Ends 26, 28, 30 and 32 are also sized to extend to within a second predetermined tolerance of the end walls of the mold cavity 9. Similarly, when plastic flows into the mold cavity 9, heat spreader 10 will not be able to move lengthwise since limbs 18, 20, 22 and 24 are firmly wedged against the end walls of the mold cavity 9.

Notches 14 and 16 serve a two-fold purpose. Firstly, by reducing the amount of metal associated with heat conductive frame 12, the amount of unwanted capacitance between heat conductive frame 12 and the lead frame 11 is reduced. In some applications, the integrated circuit which is used with the lead frame 11 is very capacitance sensitive. Therefore, a reduction in conducting surface area is often essential to minimize capacitance between heat spreader 10 and the lead frame 11. Secondly, notches 14 and 16 are very helpful in allowing plastic to freely flow into the mold cavity 9 at either end. If metal extended all the way across ends 26 and 28 and ends 30 and 32, plastic flow would be obstructed when entering the mold cavity and flow problems could result.

Another important feature of heat spreader 10 is the design of inner edges 34, 36, 38 and 40 which are made to complement or conform to the portion of the lead frame 11 which overlays limbs 18, 20, 22 and 24, respectively. The lead frame 11 has a particular design and contour and often has a radial design from a centrally located integrated circuit die. By making heat spreader 10 follow the same contour, the variation in heat spreader-lead frame capacitance from unit to unit is substantially reduced. Furthermore, inner edges 34, 36, 38 and 40 are centered between two adjacent leads of a lead frame design. As a result, the heat spreader-lead frame capacitance variation is further reduced. Thus, all semiconductor devices utilizing a particular lead frame design will have substantially the same heat spreader-lead frame capacitance.

A further feature of heat spreader 10 is the utilization of tapered edges 59, 60, 62 and 64 from end edges 26, 28, 30 and 32, respectively. The purpose of tapering end edges 26, 28, 30 and 32 is to allow more plastic to exist around the corners of the integrated circuit package and have a more durable part. Because integrated circuits can receive physical abuse during handling, this feature tends to increase the integrity of the package.

An additional feature of heat spreader 10 is the utilization of ribs 66 and 68 extending from the upper surface of heat spreader 10 to within a predetermined tolerance of the bottom surface of the lead frame. Although in the preferred form two ribs are shown, one or more ribs may be used. Further, the positioning of ribs 66 and 68 is not critical and ribs 66 and 68 may be located at any distance from notches 14 and 16 and central portion 58. Ribs 66 and 68 function to keep the plastic which is flowing in the mold cavity 9 from twisting or moving limbs 18, 20, 22 and 24 up against the lead frame 11. Therefore, the use of a rib would be more significant if positioned on the end of the mold cavity 9 where plastic is entering. However, if the manufacture of central portion 58 is within the specified predetermined tolerance, ribs 66 and 68 are not essential to heat spreader 10.

Figure 2:
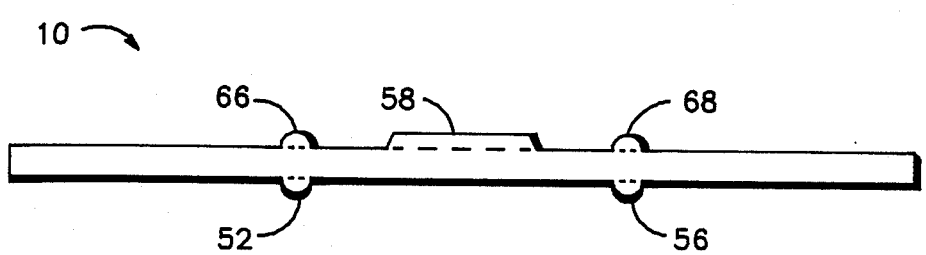
FIG. 2 illustrates a side elevational view of the heat spreader of FIG. 1.

Shown in FIG. 2 is a side elevational view of heat spreader 10. As previously noted, the positioning of ribs 66 and 68 and feet 52 and 56 with respect to central portion 58 is not critical. However, in the preferred form, all ribs, feet, limbs and standoffs are substantially symmetrical with central portion 58.

Figure 3:
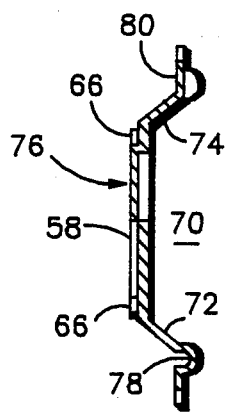
FIG. 3 illustrates a cross sectional view of a heat spreader according to this invention taken substantially on line 3—3 of FIG. 1.

Shown in FIG. 3 is a cross sectional view of heat spreader 10 taken substantially on line 3—3 of FIG. 1. An additional feature of heat spreader 10 now made apparent is a channel 70 which exists under central portion 58 and extends through notch 14 and notch 16.

Inner inclined edges 72 and 74 elevate an inner section 76 of elongated frame 12 to within a predetermined tolerance of the bottom surface of the metal lead frame 11 so that inner section 76 is higher than sides 78 and 80. Side 78 is the side which includes limbs 20 and 24, and side 80 is the side which includes limbs 18 and 22. The purpose for elevating inner section 76 is to place a substantial amount of metal heat spreader 10 as close as possible to lead frame 11 to further reduce the thermal impedance. Also, by elevating inner section 76, plastic may flow into the mold cavity 9 more freely. By now it should be apparent that the features of heat spreader 10 have been optimized to provide a low thermal impedance, free plastic flow and a low and substantially consistent heat spreader-lead frame capacitance. The features discussed also provide a heat spreader which may be easily loaded into a mold cavity since the spreader is self-positioning.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. A heat spreader adapted for insertion into a mold cavity prior to encapsulation thereof for conducting heat away from a metal lead frame and configured to minimize capacitance between the heat spreader and the lead frame, said heat spreader being substantially parallel to a first surface of the metal lead frame having a semiconductor die mounted on a first portion of the lead frame and connected to a second surface of the lead frame, the heat spreader comprising:
   a heat conductive frame having first and second notches formed in opposite ends thereof to define bifurcated limbs sized to extend into within a first predetermined tolerance of first and second end walls of said cavity, with inner edges of each such limb tapering to a predetermined one of the end walls and complementing a second portion of the lead frame which will overlay the limb when encapsulated to minimize said capacitance, at least a pair of spaced-apart lateral standoffs extending from each of first and second sides into within a second predetermined tolerance of first and second side walls of said cavity, at least a pair of spaced-apart feet extending a predetermined distance from a lower surface thereof; and
   a solid central portion adjacent said notches and extending to within a third predetermined tolerance of the first surface of the portion of said lead frame on which said die is mounted when encapsulated, whereby said first, second and third predetermined tolerances are selected so that said heat spreader is self-positioning with respect to said mold cavity and said lead frame.

2. The heat spreader of claim 1 wherein said heat spreader is made of an anodized metal.

3. The heat spreader of claim 1 further comprising at least one rib extending from an upper surface thereof to within a fourth predetermined tolerance of the first surface of said lead frame.

4. The heat spreader of claim 1 wherein said heat conductive frame comprises an elevated inner section extending substantially from the first and second notches formed in the opposite ends of the lead frame and to within a fifth predetermined tolerance of the first surface of said lead frame.

5. The heat spreader of claim 1 wherein said bifurcated limbs are tapered from the first and second sides of said heat spreader to the opposite ends of said heat conductive frame.

6. A self-positioning heat spreader adapted for insertion into a mold cavity prior to encapsulation in plastic substantially parallel to a first surface of a metal lead frame having a semiconductor die mounted on and connected to a second surface of the lead frame, the heat spreader minimizing capacitance between said heat spreader and lead frame and providing a substantially uniform capacitance between the heat spreader and the lead frame for multiple encapsulated units, comprising:
   a heat conductive frame having a solid central portion with tapered notches formed in opposite ends thereof immediately adjacent said solid central portion to define bifurcated limbs sized to extend into within a first predetermined tolerance of first and second end walls of said cavity with first and second inner edges of each such limb tapering to a predetermined one of the end walls, said tapered end notches complementing a plurality of leads of the metal lead frame which overlay each limb when encapsulated to minimize said capacitance.

7. A semiconductor device having a lead frame, a semiconductor die, and a heat spreader which minimizes capacitance between the lead frame and the heat spreader, the heat spreader comprising:
   a notch formed in at least each end of the heat spreader to define bifurcated limbs with first and second inner edges of each such limb tapering to a distal end of each limb and complementing a portion of the lead frame which will overlay the limb when encapsulated;
   at least a pair of spaced-apart lateral standoffs extending from each side of the heat spreader;
   at least a pair of spaced-apart feet extending from a first surface of the heat spreader;
   a channel formed along the first surface and extending from one of the notches to another one of the notches;
   a heat conductive frame having a solid central portion and notches in opposite ends thereof immediately adjacent said solid central portion, said notches extending from each end of the heat conductive frame so that a substantial portion of each lead of the lead frame overlays one of said notches to minimize said capacitance; and
   a raised portion on a second surface of the heat spreader to be placed in close proximity to the semiconductor die, and the second surface has an insulating film to prevent electrically conductive contact between the heat spreader and the lead frame.

* * * * *